(12) United States Patent
McIntyre et al.

(10) Patent No.: US 7,899,634 B1
(45) Date of Patent: Mar. 1, 2011

(54) METHOD AND APPARATUS FOR ANALYSIS OF CONTINUOUS DATA USING BINARY PARSING

(75) Inventors: Michael G. McIntyre, Austin, TX (US); Michael A. Retersdorf, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 1502 days.

(21) Appl. No.: 11/269,418

(22) Filed: Nov. 7, 2005

(51) Int. Cl.
*G01N 37/00* (2006.01)
(52) U.S. Cl. .......................................... 702/81
(58) Field of Classification Search ............ 702/81, 702/82, 83, 84, 127, 128, 133, 135
See application file for complete search history.

(56) References Cited

U.S. PATENT DOCUMENTS

| 6,365,425 B1 * | 4/2002 | Ikota et al. ............. 438/16 |
| 2004/0031779 A1 * | 2/2004 | Cahill et al. ........ 219/121.83 |

* cited by examiner

*Primary Examiner* — Aditya Bhat
(74) *Attorney, Agent, or Firm* — Williams, Morgan & Amerson, P.C.

(57) ABSTRACT

A method, apparatus, and a system for generating a binary mapping of wafer regions using measured value. A first measured value relating to processing a first workpiece is acquired. A second measured value relating to a second workpiece is acquired. At least a first region common to the first and second workpieces is defined. A determination is made as to whether the results associated with the first or second measured value is above a predetermined threshold. A first binary value is assigned to the first region based upon a determination that the results associated the first or second measured value data is above the threshold.

19 Claims, 8 Drawing Sheets

METHOD AND APPARATUS FOR ANALYSIS OF CONTINUOUS DATA USING BINARY PARSING

BACKGROUND OF THE INVENTION

1. Field of the Invention

This invention relates generally to semiconductor manufacturing, and, more particularly, to a method and apparatus for performing generating binary data from continuous data for performing automated analysis routines.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using a patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a specific manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on single or multiple die 103 locations at a time, depending on the specific photomask employed. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a flowchart depiction of a prior art process flow is illustrated. A manufacturing system may process one or more semiconductor wafers (block 210). Upon processing the wafer, the manufacturing system may acquire metrology data relating to the processing of the wafers (block 210). For further analysis of the metrology data, the manufacturing system may store the acquired metrology data (block 230). The manufacturing system may continue to process additional wafers (block 240). Upon processing of the additional wafers, metrology data relating to the subsequently processed wafers may be acquired and stored (block 250). Based on the accumulated metrology data, a standard deviation analysis may be performed (block 250). This process may include analyzing various characteristics (e.g., as metrology information, speed grades, etc.) relating to the quality of the processed die. The standard deviation analysis provides for a continuous data stream that provides indications of the characteristics of various portions of a plurality of wafers. Even binary-type data, (e.g., whether a particular wafer region passes a test or not), may become an analog-style continuous signal when analyzing data relating to several wafers. Accordingly, state-of-the-art systems provide an analog, continuous type data relating the characteristics of the die of various wafers. Analyzing this type of data relating to a plurality of wafers to identify a problem region across several wafers is difficult. State-of-the-art standard deviation analysis does not provide efficient multi-wafer data analysis since each analysis of a portion of several wafers provides many different results that are difficult to quantify as a single data representation. Therefore, analysis of multiple wafer data sets for identifying a common problem area across several wafers may be inefficient and cumbersome when using state-of-the-art technology.

The present invention is directed to overcoming, or at least reducing, the effects of one or more of the problems set forth above.

SUMMARY OF THE INVENTION

In one aspect of the present invention, a method is provided for generating a binary mapping of wafer regions using measured value. A first measured value relating to processing a first workpiece is acquired. A second measured value relating to a second workpiece is acquired. At least a first region common to the first and second workpieces is defined. A determination is made as to whether the results associated with the first or second measured value is above a predetermined threshold. A first binary value is assigned to the first region based upon a determination that the results associated the first or second measured value data is above the threshold.

In another aspect of the present invention, a method is provided for generating a binary mapping of wafer regions using continuous value. A first measured value data relating to processing a first workpiece and a second measured value data relating to a second workpiece are acquired. A first region common to the first and second workpieces is defined. A second region common to the first and second workpieces is defined. A determination is made as to whether a cumulative result associated with the first and second measure value data is above a predetermined threshold. A first binary value is assigned to the first region based upon the determining whether the cumulative result is above the threshold. A second binary value is assigned to the second region based upon the determining whether the cumulative result is below the threshold.

In another aspect of the present invention, a method is provided for generating a binary mapping of wafer regions using continuous value. A first workpieces is processed. Continuous value data associated with processing the first workpiece is acquired. A second workpiece is processed. Continuous value data associated with processing the second workpiece is acquired. A plurality of portions of the continuous value data associated with the first workpiece are correlated to a first region and a second region on the first workpiece. A plurality of portions of the continuous value data associated with the second workpiece are correlated to a first region and a second region on the second workpiece. The first region on the second workpiece corresponds to the first region on the first workpiece and the second region on the second workpiece corresponds to the second region on the first workpiece. A determination is made as to whether a cumulative result associated with the continuous value data associated with the first and second workpieces is above a predetermined threshold. A first binary value is assigned to the first region based upon the determining whether the cumulative result is above the threshold to generate a first binary region. A second binary value is assigned to the second region based upon the determining whether the cumulative result is below the threshold to generate a second binary region. A wafer map is generated using the first and the second binary regions.

In yet another aspect of the present invention, a method is provided for generating a binary mapping of wafer regions using continuous value. A plurality of workpieces are processed. A continuous value relating to processing a plurality of workpieces is acquired. An area common to the plurality of workpieces is defined. The area includes at least one common die location of the workpieces. A determination is made as to whether a predetermined percentage of continuous value results respectively corresponding to the plurality of workpieces are above a desired level. A first binary value is assigned to the area based upon determining that the predetermined percentage of continuous value results respectively corresponding to the plurality of workpieces are above a desired level. A second binary value is assigned to the area based upon determining that the predetermined percentage of continuous value results respectively corresponding to the plurality of workpieces are below a desired level.

In another aspect of the present invention, a method is provided for generating a binary mapping of wafer regions using continuous value. A plurality of workpieces are processed. A continuous value data relating to processing a plurality of workpieces is acquired. A region common to the plurality of workpieces is defined. The region comprises at least one common die region of the workpieces. A determination is made as to whether a predetermined percentage of continuous value data results respectively corresponding to the plurality of workpieces are above a desired level. A first binary value is assigned to the region based upon determining that the predetermined percentage of continuous value data results respectively corresponding to the plurality of workpieces are above a desired level. A second binary value is assigned to the region based upon determining that the predetermined percentage of continuous value data results respectively corresponding to the plurality of workpieces are below a desired level. A pattern recognition analysis based upon the first and second binary values is performed.

In another aspect of the present invention, a system is provided for generating a binary mapping of wafer regions using continuous value. The system includes a plurality of workpieces; a processing tool to process the workpieces; a measurement tool to acquire continuous value data relating to the workpieces; and a controller. The controller adapted to organize the continuous value data to associated results relating to the continuous value data into a region common to the workpiece. The controller is also adapted to also determine whether a predetermined percentage of organized continuous value data associated with the region is above a predetermined level. The controller is adapted to assign a first binary value to the region based upon determining that the predetermined percentage of organized continuous value data is above a desired level. The controller is also adapted to assign a second binary value to the region based upon determining that the predetermined percentage of organized continuous value data is below a predetermined level.

In another aspect of the present invention, an apparatus is provided for generating a binary mapping of wafer regions using continuous value. The apparatus comprises means for acquiring a first measured value relating to processing a first workpiece and a second measured value relating to a second workpiece; means for defining at least a first region common to the first and second workpieces; means for determining whether the results associated with at least one of the first and second measured values data is above a predetermined threshold; and means for assigning a first binary value to the first region based upon a determination that results associated with at least one of the first and second measured value is above the predetermined threshold.

In yet another aspect of the present invention, a computer readable program storage device encoded with instructions is provided for generating a binary mapping of wafer regions using continuous value. The computer readable program storage device is encoded with instructions that, when executed by a computer, performs a method, comprising: acquiring a first measured value relating to processing a first workpiece and a second measured value relating to a second workpiece; defining at least a first region common to the first and second workpieces; determining whether the results associated with at least one of the first and second measured values data is above a predetermined threshold; and assigning a first binary value to the first region based upon a determination that results associated with at least one of the first and second measured value is above the predetermined threshold.

BRIEF DESCRIPTION OF THE DRAWINGS

The invention may be understood by reference to the following description taken in conjunction with the accompanying drawings, in which like reference numerals identify like elements, and in which.

Figure 1:
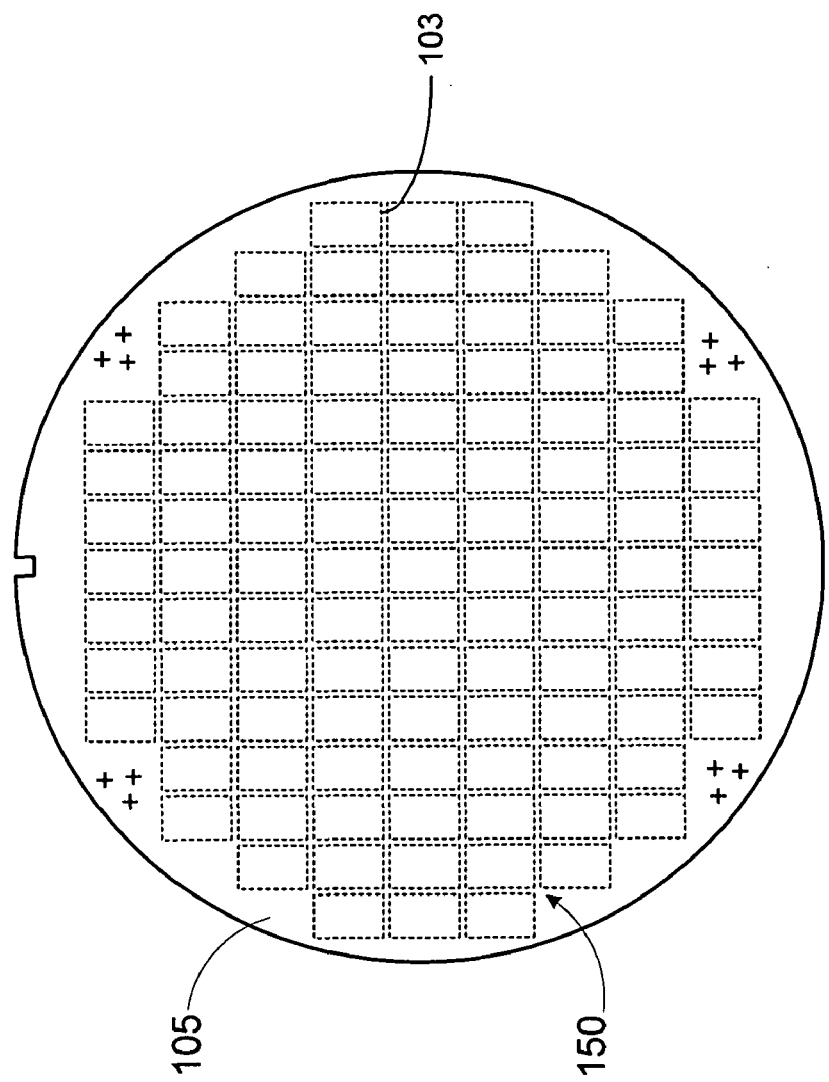
FIG. 1 illustrates a stylized depiction of a semiconductor wafer that may be processed by a semiconductor manufacturing system.
Figure 2:
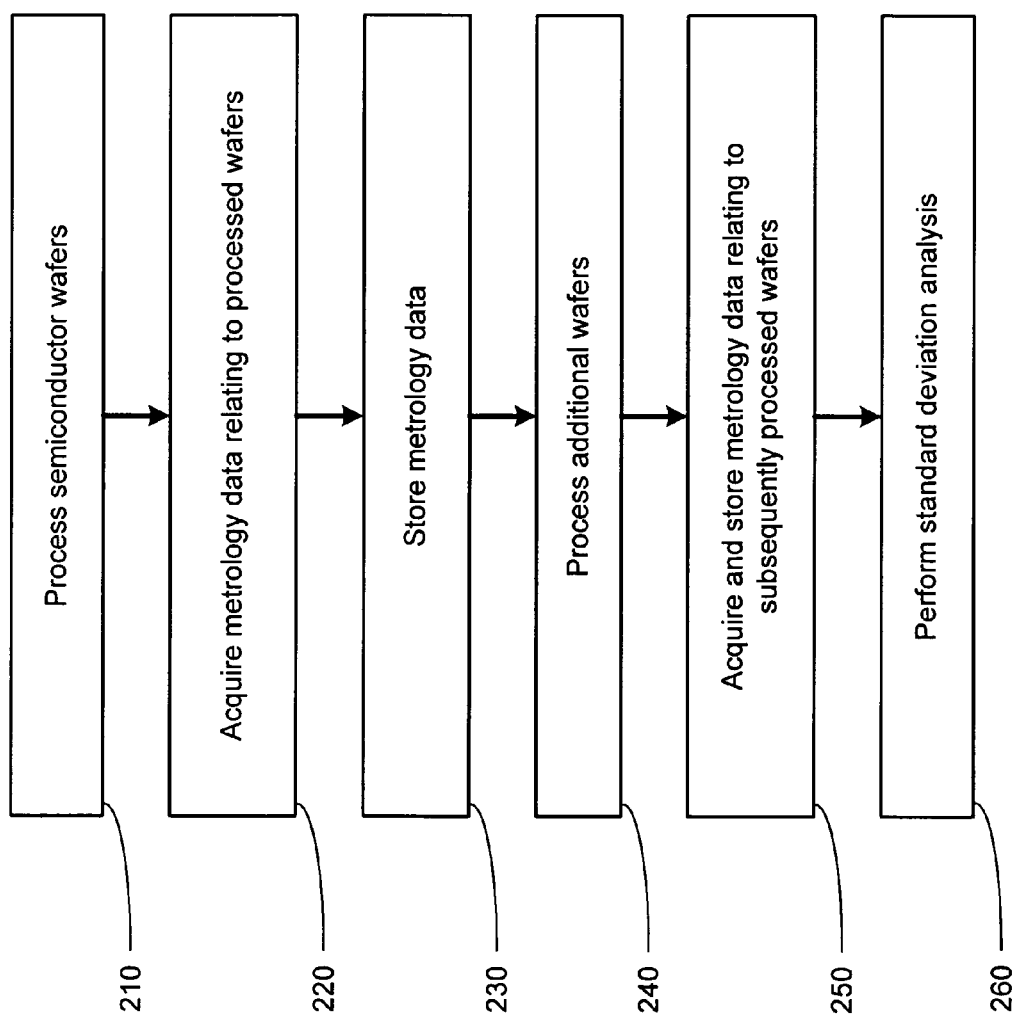
FIG. 2 illustrates a flowchart depiction of a prior art method for processing semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will, of course, be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

The present invention will now be described with reference to the attached figures. Various structures, computers, process tools, and systems are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for methods, apparatuses, and systems for processing continuous value data into a binary format for multi-wafer data analysis. Data relating to various semiconductor wafers 105 may be collected and organized in a fashion such that continuous data relating to one or more regions of several wafers may be analyzed. Based upon multiple sets of data (i.e., continuous data) relating to respective regions of a plurality of wafers, a conversion of the data into a binary format may be performed for pattern recognition purposes, statistical analysis purposes, etc. In other words, data relating to characteristics of a common region(s) across several wafers may be processed and represented in a binary format. Using binary representations of a characteristic of common regions across several wafers, patterns relating to the regions may be efficiently recognized.

A threshold may be selected such that a predetermined number of common regions displaying continuous value results below the threshold may be assigned a binary value, e.g., "0". Likewise, a predetermined number of regions that are common across a plurality of wafers displaying a continuous value result that is above a threshold may be assigned the alternative binary value, e.g., "1". For example, a threshold of an X % yield results relating to a particular common region across a plurality of wafers may result in the indication that the particular common region does not provide a yield result that is above the predetermined X % threshold. Therefore, this region may be assigned a binary value of "0". Likewise, if another region indicates that its yield result is above a predetermined threshold of X %, that common region may be assigned a value of "1". Similarly, various other common regions may be analyzed and binary values may be assigned to those regions. These regions may correspond to a particular die that may result in a single integrated circuit chip, a group of die regions, or any other type of subdivision of a wafer. The continuous value data may relate to any number of measurable characteristics, such as yield results, speed, performance results, metrology data (e.g., film thickness, line-width, etc.), defect data, parametric data, and/or various other manufacturing measurements. Utilizing embodiments of the present invention, a binary pattern relating to various regions common across several wafers may be developed. Using this pattern, a pattern recognition analysis may be performed.

This analysis may be used to assess the performance of the processing steps that were used to manufacture the die regions associated with various common regions across a plurality of wafers. Based upon this analysis, process adjustments, such as feedback and/or feed forward adjustments, may be performed to improve the process results.

Figure 3:
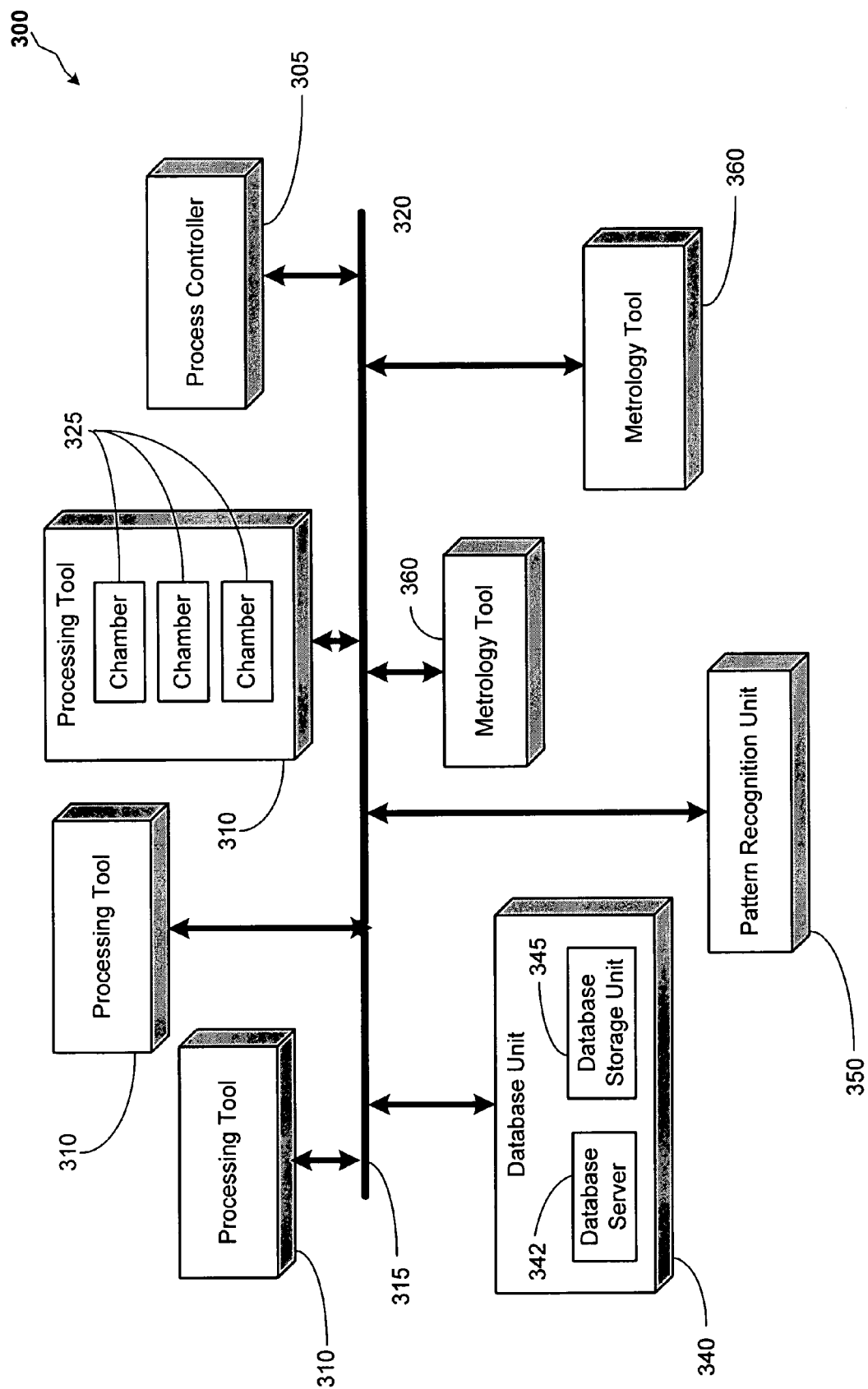
FIG. 3 depicts a block diagram of a system, in accordance with one illustrative embodiment of the present invention.

Turning now to FIG. 3, a system 300 in accordance with embodiments of the present invention is illustrated. A process controller 305 in the system 300 is capable of controlling various operations relating to a plurality of processing tools 310. The processing tools 310 may comprise a plurality of chambers 325, each of which may process wafers. The system 300 is also capable of acquiring continuous value data, such as metrology data related to processed semiconductor wafers 105, performance data, yield data, etc. The system 300 may also comprise a plurality of metrology tools 360 to acquire metrology data related to the processed semiconductor wafers 105.

The system 300 may also comprise a database unit 340. The database unit 340 is provided for storing a plurality of types of data, such as manufacturing-related data, data related to the operation of the system 300 (e.g., the status of the processing tool 310, the status of semiconductor wafers 105, etc.). The database unit 340 may store tool state data relating to a plurality of process runs performed by the processing tool 310. The database unit 340 may comprise a database server 342 for storing tool state data and/or other manufacturing data related to processing of wafers, into a database storage unit 345.

The system 300 may also comprise a pattern recognition unit 350. The pattern recognition unit 350 may comprise a controller and/or other circuitry, such as registers, memory devices, etc., to perform a binary mapping of various common regions across a plurality of wafers. For example, the left quadrant of a plurality of wafers may be identified as a common region and the continuous value results relating to the common regions of wafers may be tabulated by the pattern recognition unit 350. Based upon this tabulation, a predetermined threshold may be used to determine whether a certain percentage of the components of a region meet the predetermined threshold criteria. Upon an indication that the minimum percentage of components of a region meet the predetermined threshold, the pattern recognition unit 350 may assign a binary value of, e.g., "1", to that region based upon the components of the region surpassing the threshold. Otherwise, a binary value of "0" may be assigned to that region. Based upon this technique, various regions may be identified and based upon surpassing a threshold; a binary value may be assigned to the regions to allow for binary pattern recognition of various regions on a wafer map. The pattern recognition results may be indicative of the performance of the processes that produce the results associated with the various regions. Based upon this pattern recognition process, various statistical analyses or other analysis may be performed to provide for adjustment(s) to the operation of the processing tools 310. Additionally, further calibration or adjustments to the metrology tools 360 may be performed as a result of the pattern recognition provided by the pattern recognition unit 350. The process controller 305 is capable of performing feedback and/or feed-forward adjustments based upon the pattern recognition data.

The process controller 305 and/or the pattern recognition unit 350 may comprise software components, hardware components, firmware components, and/or a combination thereof.

Figure 4:
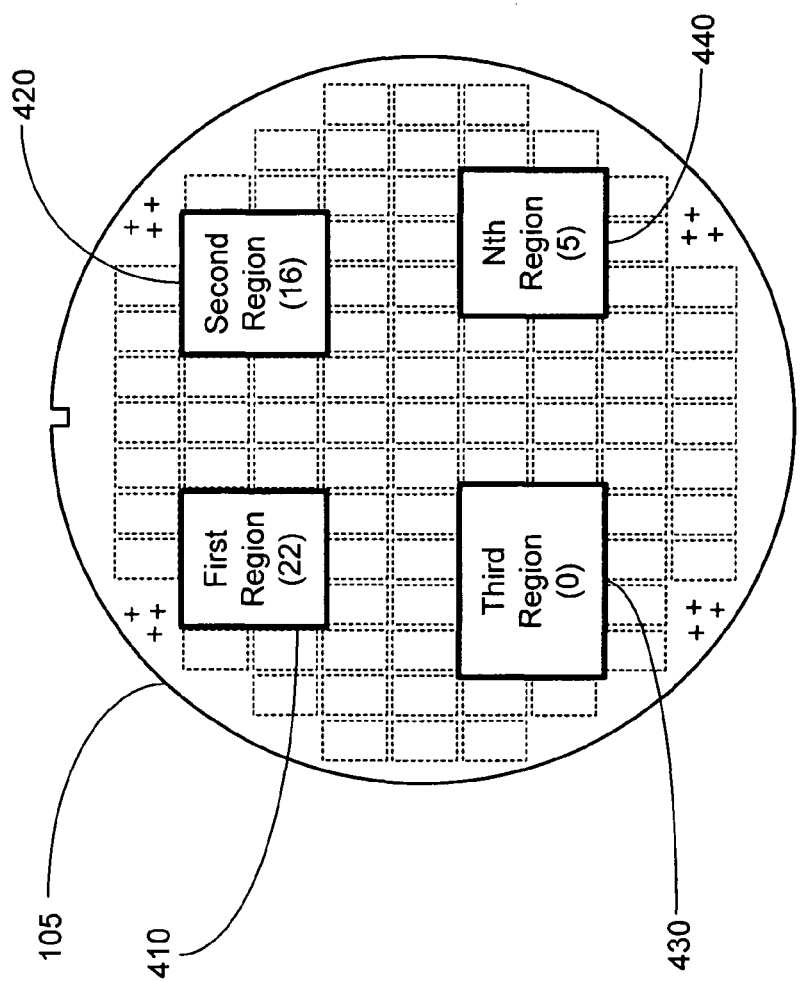
FIG. 4 depicts a semiconductor wafer being categorized into various regions, which is associated with an exemplary continuous value data relating with that region, in accordance with one illustrative embodiment of the present invention.

Turning now to FIG. 4, an illustrative example of a wafer map, wherein a semiconductor wafer 105 is subdivided into various regions in accordance with one illustrative embodiment of the present invention is provided. For example, the semiconductor wafer 105 may be subdivided into a first region 410, a second region 420, a third region 430, through an $N^{th}$ region 440. These regions 410-440 may be defined by various portions of the wafers, e.g., each of the regions 410-440 may be defined by an individual, respective die. These regions 410-440, illustrated in the wafer-mapping of FIG. 4 may be associated with the continuous value data results of corresponding regions across a plurality of wafers. For example, the first region 410 represents the similar geographic region across several wafers. The first through $N^{th}$ regions 410-440 may each comprise an individual die, a plurality of die, or another grouping methodology, e.g., a die area that is destined to become a part or whole of an integrated chip, or any other grouping. In one embodiment, the first region 410 may be associated with continuous value results that indicate a numerical value 22. This value may correspond to an indication that respective first regions across 22 wafers out of 50 wafers of a batch/lot have each successfully yielded an acceptable die or die region. Similarly, the second region 420 is associated with a continuous value data result of 16. This value may indicate that 16 die regions of the 50 wafers relating to the second region 420 produced acceptable process yields. As another example, the third region 430 may not have yielded any die from the 50 wafer batch, which corresponds to a 0 yield for that particular region across the entire wafer lot. Also, the $N^{th}$ region 440 may have yielded 5 die regions that contain acceptable die yield.

Figure 5:
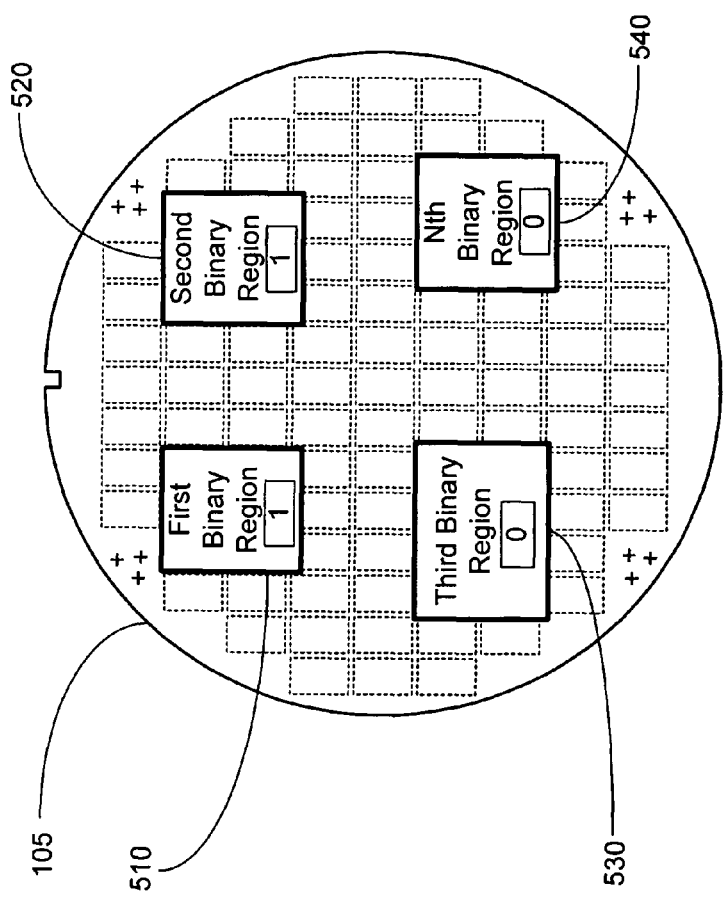
FIG. 5 depicts a semiconductor wafer divided into various regions containing a binary type signal based upon a predetermined threshold relating to continuous value data across a plurality of wafers, in accordance with one illustrative embodiment of the present invention.

This continuous value data may then be converted into a binary format utilizing embodiments of the present invention. The continuous data results representing data from various corresponding regions across a plurality of wafers may be compared against a predetermined threshold. Referring simultaneously to FIGS. 4 and 5, the conversion of continuous value data is performed by converting the continuous data from various wafers into a binary format in accordance with an illustrative embodiment of the present invention. FIG. 5 illustrates a semiconductor wafer 105 comprising a first binary region 510, a second binary region 520, a third binary region 530, and an $N^{th}$ binary region 540. The first through $N^{th}$ binary regions, 510-540, correspond respectively to the first through $N^{th}$ regions 410-440 of FIG. 4.

A predetermined threshold may be established to analyze the continuous data results of particular regions of FIG. 4 in order to convert the data relating to individual regions into the binary representation of all of the common individual regions, as illustrated in FIG. 5. For example, a particular threshold of X % (e.g., 30%) may be established as a yield threshold. Using the exemplary 30% threshold, in a wafer batch of 50 wafers, a yield result of 15 acceptable die associated with a region must be found in order to cross the threshold and to assign a positive binary value to that region. Therefore, in examining this example, the first and the second regions 410-420, which respectively produced 22 and 16 acceptable die, cross the predetermined 30% threshold of acceptable yield (i.e., minimum of 15 acceptable die regions). Accordingly, the first and the second regions 410-420 may be respectively converted to a first and second binary regions 510-520 with a binary assigned value of "1" since the regions 410-420 surpassed the threshold. In this example, the third and the $N^{th}$ regions 430, 440, respectively produce 0 and 5 acceptable die regions. Therefore, the yields associated with these regions are below the predetermined 30% threshold. Accordingly, the third and the fourth regions, 430 and 440 are respectively converted to the third binary and the fourth binary regions 530-540. Since in this example, the data relating to the third and fourth regions 430, 440 did not meet the 30% threshold, the third and the fourth binary regions 530, 540 are assigned the binary value of "0", as illustrated in FIG. 5, since the regions 430-440 did not surpass the threshold. Therefore, continuous value results associated with the particular regions across a plurality of wafers are converted to a binary result using a predetermined threshold. Using this technique, a pattern is established as to which regions produce acceptable die results. Based upon these results, process adjustments relating to the third and Nth regions 530-540, may be performed until the $3^{rd}$ and the $4^{th}$ binary regions also indicate a positive binary value of "1". The adjustments may include process adjustments, such as modification of particular processes, such as etch time, adjustment of control parameters associated with a chemical mechanical polishing (CMP) process, adjustment to an ion implant process parameter, adjustment to phototypography processes, adjustment to deposition processes, etc.

Figure 6:
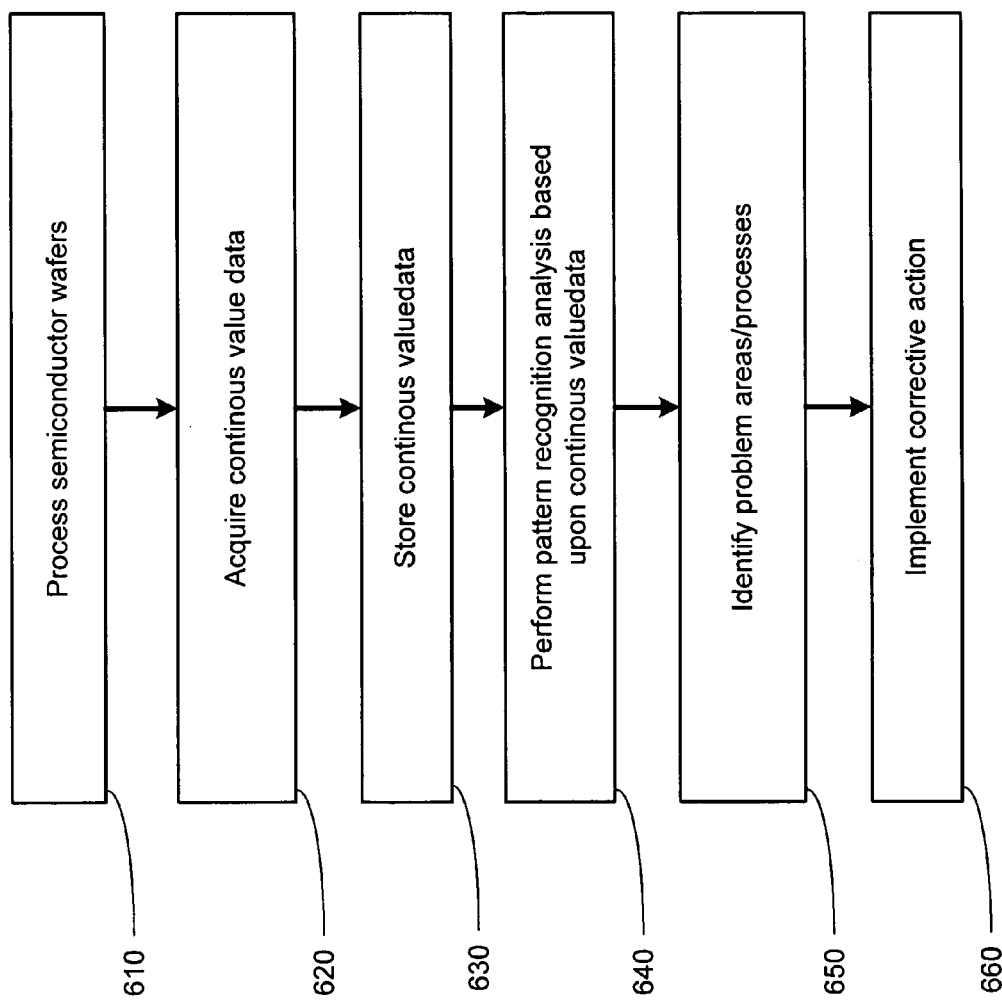
FIG. 6 depicts a flowchart depiction of a method in accordance with one illustrative embodiment of the present invention.

Turning now to FIG. 6, a flowchart depiction of the method in accordance with one illustrative embodiment of the present invention is provided. The system 300 may process a plurality of wafers associated with a lot (block 610). Based upon the processes performed on the wafers, the system 300 may acquire continuous value data (block 620). The continuous value data may relate to various types of measurable parameters, such as performance results (e.g., speed of operation of the circuitry in the die), metrology results, yields results, wafer electrical test (WET) results, defect data, etc. The continuous value data may then be stored until a significant number (e.g., two or more) of data points are acquired (block 630). The continuous value data may relate to various wafer-regions that are common across a plurality of wafers.

Based upon the stored continuous value data of various common regions across various wafers in a lot or in a batch, the system 300 may perform a pattern recognition analysis (block 640). The pattern recognition analysis may provide data comprising a binary indication of a plurality of regions indicative of a characteristic of the die portions of various wafers corresponding to a particular region. The data may also include the type of characteristics that were analyzed, as well as the data used to generate the binary mapping. Based upon the pattern recognition data, various adjustments or corrections to processes may be identified (block 650). Based upon the corrections that are identified, the system 300 may implement corrective action(s) by performing various feedback and/or feed forward adjustments to various processes (block 660).

Figure 7:
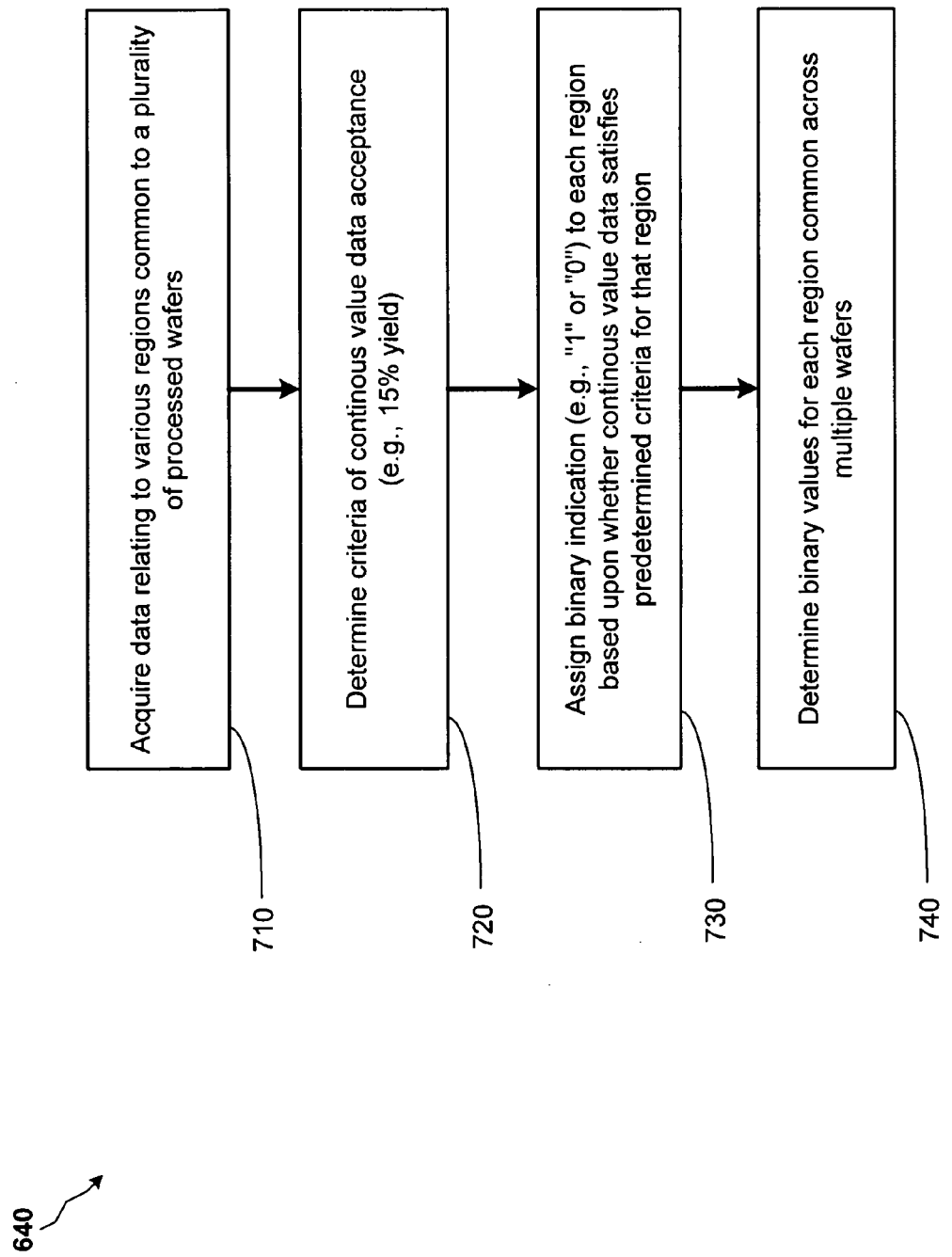
FIG. 7 depicts a more detailed flowchart depiction of the steps for performing a pattern recognition analysis of FIG. 6, in accordance with one embodiment of the present invention.

Turning now to FIG. 7, a more detailed flowchart depiction of the steps for performing the pattern recognition analysis of block 640 of FIG. 6, is illustrated. Based upon the continuous value data acquired by the system 300, data relating to various regions are acquired, sorted, and organized (block 710). For example, the continuous value data relating to a particular region common to a plurality of wafers are organized. For example, as illustrated in FIG. 4, the first region 410 may comprise 22 wafers out of 50 wafers that each contains regions that housed an acceptable die.

Figure 8:
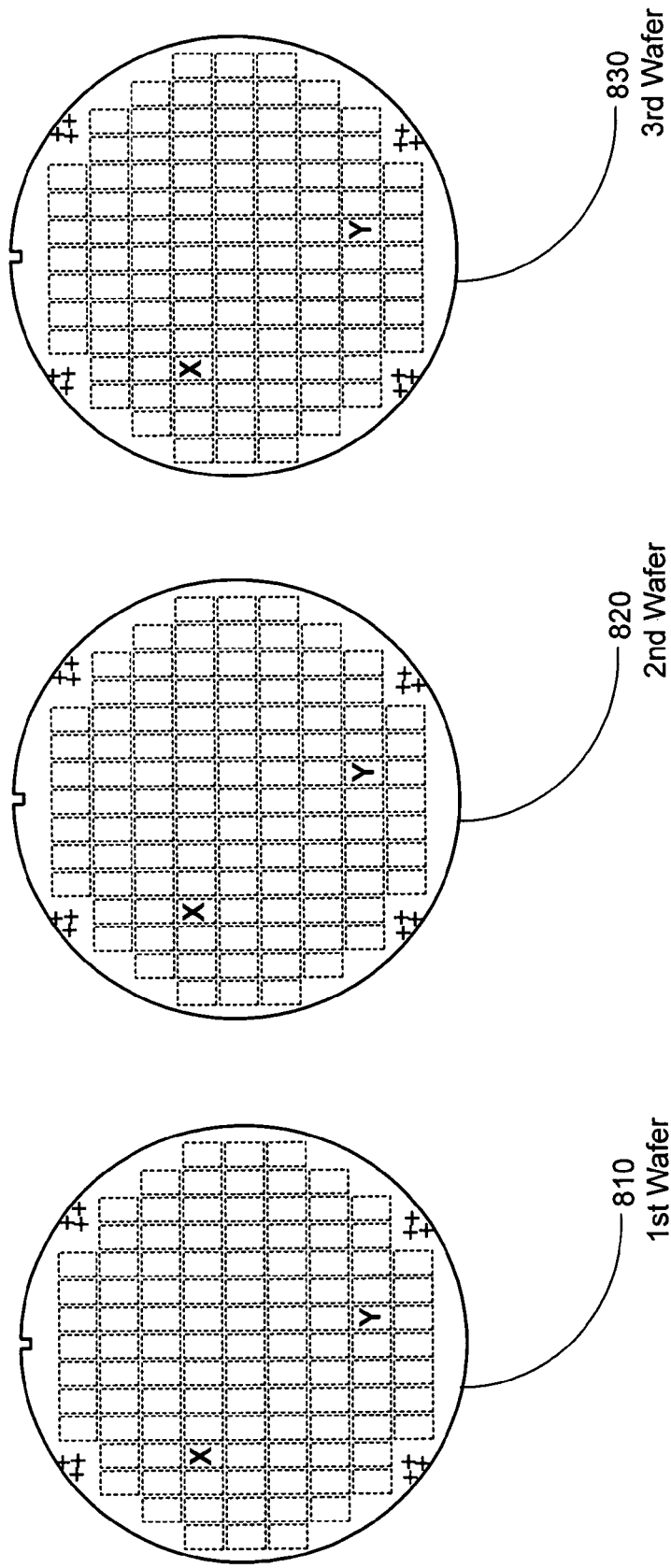
FIG. 8 depicts a stylized set of wafers each comprising a plurality of labeled regions, in accordance with one embodiment of the present invention.

Referring to FIG. 8, an illustration of a plurality of regions across a plurality of wafers are illustrated. FIG. 8, illustrates a $1^{st}$ wafer 810, a $2^{nd}$ wafer 820, and a $3^{rd}$ wafer 830. Each of the $1^{st}$ through $3^{rd}$ wafers 810-830 contain a corresponding region each comprising a die and denoted by a label "X". Similarly, each of the $1^{st}$ through $3^{rd}$ wafers 810-830 contain another corresponding region each comprising a die and denoted by a label "Y". The "X" and "Y" region are defined by a die that corresponds to the same location across the $1^{st}$ through $3^{rd}$ wafers 810-830. Continuous value data relating to the "X" regions as well as the "Y" regions across the $1^{st}$ through $3^{rd}$ wafers 810-830 may be acquired and analyzed to determine if the aggregate value of the "X" and "Y" regions surpass a predetermined threshold. When the aggregate value of all of the "X" regions surpass a predetermined threshold, a binary value of "1" may be assigned to the "X" region on a wafer map. Likewise, when the aggregate value of all of the "X" regions are found to below a predetermined threshold, a binary value of "0" may be assigned to the "X" region on a wafer map.

Referring back to FIG. 7, the system 300 may also determine a criterion of continuous value data acceptance. For example, a certain yield percentage that is acceptable as a particular threshold may be selected. Various criteria may be implemented, such as identifying various portions of data in a continuous distribution, such as the lower 95% of a particular continuous value result, the lower 75%, the upper 95% and/or the upper 75%. Based upon the criteria of analyzing the continuous distribution, the system 300 may assign a binary indication, e.g., a "1" or a "0", to each common region of the wafer map, based upon whether the continuous value data satisfied the predetermined criteria for that particular region (block 730). For example, all of the continuous value results relating to the lower 95%, the lower 75%, the upper 75%, or the upper 95% of a particular continuous value result may be identified with a digital signal of "1", wherein, all other data points that did not exceed the threshold is assigned a digital signal of "0".

As another example, a particular region that netted a certain number of acceptable yield die results may be assigned a "1", wherein, another region that produces significantly lower amounts of acceptable die regions may be assigned a binary value of "0". This step produces a pattern of regions (i.e., common regions that correspond to similar regions across a plurality of wafers) on a wafer map. Therefore, a binary pattern may be determined for each region relating to multiple wafers (block 740). This process may produce pattern recognition data that provides sufficient data to efficiently decipher process results relating to various common regions across a plurality of wafers. Various statistical analyses and/or other numerical analysis may be performed to analyze the patterns and perform corrective actions. These corrective actions may include modifying control parameter of various processes.

Utilizing embodiments of the present invention, a plurality of continuous value data relating to various regions on a wafer map may be efficiently analyzed. Continuous distribution of continuous value data may be then converted into a digital/binary type format for efficient pattern recognition of regions on a wafer map. Therefore, efficient deciphering of process results relating to particular regions of a wafer map may be performed. This provides for effective control adjustments to improve process results of die portions associated with various regions across a plurality of semiconductor wafers 105. The pattern recognition data may be reported back to the process controller 305 or to a passive data storage location in the database 340, along with the context of the rules used to generate the wafer map. Therefore, efficient analysis of various signals relating to the binary patterns of the regions may be performed. Any pattern recognition system known to those skilled in the art having benefited the present disclosure may be utilized to analyze the patterns to perform further analysis. This analysis then may be used to perform control adjustments to various processes in the system 300.

The principles taught by the present invention can be implemented in an Advanced Process Control (APC) Framework. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    processing a plurality of workpieces using a process tool;
    acquiring a first measured value related to a first predetermined region of each of the plurality of workpieces;
    comparing the first measured value of each of the plurality of workpieces to a predetermined threshold;
    assigning a first binary value to said first region of the plurality of workpieces based upon a preselected number of the workpieces having a first measured value that is below said predetermined threshold; and
    adjusting the processing of a workpiece in response to the first binary value being assigned to the first region of the plurality of workpieces.

2. The method of claim 1, further comprising:
    acquiring a second measured value related to a second predetermined region of each of the plurality of workpieces;
    comparing the second measured value of each of the plurality of workpieces to a predetermined threshold;
    assigning a first binary value to said second region of the plurality of workpieces based upon a preselected number of the workpieces having a second measured value that is below said second predetermined threshold; and
    adjusting the processing of a workpiece in response to the first binary value being assigned to the second region of the plurality of workpieces.

3. The method of claim 1, wherein adjusting the processing of a workpiece further comprises adjusting the processing of a subsequent workpiece.

4. The method of claim 1, further comprising assigning a second binary value to said first region of the plurality of workpieces based upon a preselected number of the workpieces having a measured value that is above said predetermined threshold.

5. The method of claim 2, wherein acquiring said first and second measured values comprises acquiring said first and second measured values respectively relating to a first semiconductor die and a second semiconductor die.

6. The method of claim 2, wherein acquiring a second measured value related to a second predetermined region comprises acquiring a second measured value related to a die.

7. The method of claim 2, further comprising generating a wafer map using said first and said second regions.

8. The method of claim 7, further comprising performing a pattern recognition analysis based upon said wafer map.

9. The method of claim 1, wherein adjusting the processing of a workpiece in response to the first binary value being assigned to the first region of the plurality of workpieces further comprises performing at least one of a feedback process and a feed-forward process adjustment.

10. The method of claim 1, wherein acquiring a first measured value comprises acquiring at least one of a performance characteristic associated with said first region, a parametric data, and a metrology data associated with said first region.

11. The method of claim 10, wherein acquiring said metrology data associated with said first region comprises acquiring data relating to at least one of a thickness of a layer, a photolithography process parameter, an etch result parameter, a chemical-mechanical polishing result parameter, a deposition process result parameter, and an ion implant process result parameter.

12. The method of claim 10, wherein acquiring a performance characteristic associated with said first region further comprises acquiring information regarding speed associated with a die region associated with said first region.

13. An apparatus, comprising:
    means for processing a plurality of workpieces using a process tool;
    means for acquiring a first measured value related to a first predetermined region of each of the plurality of workpieces means for comparing the first measured value of each of the plurality of workpieces to a predetermined threshold;
    means for assigning a first binary value to said first region of the plurality of workpieces based upon a preselected number of the workpieces having a first measured value that is above said predetermined threshold; and
    means for adjusting the processing of a workpiece in response to the first binary value being assigned to the first region of the plurality of workpieces.

14. A non-transitory computer readable program storage device encoded with instructions that, when executed by a computer, performs a method, comprising:
    processing a plurality of workpieces using a process tool;
    acquiring a first measured value related to a first predetermined region of each of the plurality of workpieces
    comparing the first measured value of each of the plurality of workpieces to a predetermined threshold;
    assigning a first binary value to said first region of the plurality of workpieces based upon a preselected number of the workpieces having a first measured value that is above said predetermined threshold; and
    adjusting the processing of a workpiece in response to the first binary value being assigned to the first region of the plurality of workpieces.

15. The computer readable program storage device encoded with instructions that, when executed by a computer, performs the method of claim 14, further comprising processing a subsequent workpiece.

16. The computer readable program storage device encoded with instructions that, when executed by a computer, performs the method of claim 14, further comprising assigning a second binary value to said first region based determining that results associated with at least one of said first and second measured value is below said threshold.

17. The computer readable program storage device encoded with instructions that, when executed by a computer, performs the method of claim 14, the method further comprising:

acquiring a second measured value related to a second predetermined region of each of the plurality of workpieces;

comparing the second measured value of each of the plurality of workpieces to a predetermined threshold;

assigning a first binary value to said second region of the plurality of workpieces based upon a preselected number of the workpieces having a second measured value that is above said second predetermined threshold; and adjusting the processing of workpieces in response to the first binary value being assigned to the second region of the plurality of workpieces.

18. The computer readable program storage device encoded with instructions that, when executed by a computer, performs the method of claim 17, the method further comprising performing a pattern recognition analysis based upon said first and said second binary values.

19. The computer readable program storage device encoded with instructions that, when executed by a computer, performs the method of claim 18, the method further comprising performing at least one of a feedback process and a feed-forward process adjustment based upon said pattern recognition analysis.

* * * * *